(12) United States Patent
Chan et al.

(10) Patent No.: US 6,704,515 B1
(45) Date of Patent: Mar. 9, 2004

(54) FIBER OPTIC INTERFACE MODULE AND ASSOCIATED FABRICATION METHOD

(75) Inventors: Eric Yuen-Jun Chan, Mercer Island, WA (US); Quynhgiao Nguyen Le, Bellevue, WA (US); Yuing Huang, Seattle, WA (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 09/476,304

(22) Filed: Dec. 30, 1999

(51) Int. Cl.7 .................................................. H04B 10/00
(52) U.S. Cl. ....................... 398/116; 398/117; 398/156; 398/164
(58) Field of Search .............................. 385/88, 93, 89, 385/92, 139; 359/180, 188, 189; 350/96; 398/164, 182, 200, 135, 136, 138, 139, 156, 117, 116

(56) References Cited

U.S. PATENT DOCUMENTS

| | | | |
|---|---|---|---|
| 4,911,519 A | * | 3/1990 | Burton et al. .................. 385/14 |
| 4,989,934 A | | 2/1991 | Zavracky et al. |
| 5,040,868 A | * | 8/1991 | Waitl et al. .................... 385/33 |
| 5,113,466 A | * | 5/1992 | Acarlar et al. ................. 385/88 |
| 5,123,066 A | * | 6/1992 | Acarlar ......................... 385/14 |
| 5,353,364 A | * | 10/1994 | Kurashima .................... 385/88 |
| 5,432,630 A | * | 7/1995 | Lebby et al. ................. 359/152 |
| 5,493,437 A | | 2/1996 | Lebby et al. |
| 5,535,034 A | | 7/1996 | Taniguchi |
| 5,535,296 A | | 7/1996 | Uchida |
| 5,536,906 A | * | 7/1996 | Haas et al. ................. 174/52.4 |
| 5,561,727 A | | 10/1996 | Akita et al. |
| 5,596,664 A | | 1/1997 | Bostica et al. |
| 5,663,871 A | * | 9/1997 | Bayani ........................ 361/784 |
| 5,687,267 A | | 11/1997 | Uchida |
| 5,731,633 A | | 3/1998 | Clayton |

FOREIGN PATENT DOCUMENTS

EP          505744 A2 *  9/1992  ............ H01R/9/07

OTHER PUBLICATIONS

Chan, E.Y.; Le, Q.N.; Beranek, M.W. ☐☐Electronic Components & Technology Conference, 1998. 48th IEEE, 1998 ☐☐Page(s): 410–417☐☐.*

(List continued on next page.)

*Primary Examiner*—Leslie Pascal
*Assistant Examiner*—Dalzid Singh
(74) *Attorney, Agent, or Firm*—Alston & Bird LLP (57) ABSTRACT

More cost-effective fiber optic interface modules, such as fiber optic transmitter modules and fiber optic receiver modules, are provided that meet the high performance requirements demanded by avionics and other specialized applications over a wide range of temperatures and other environmental conditions. The fiber optic interface module includes a printed wiring board having a pair of outwardly extending arms that define a notch therebetween. The fiber optic interface module also includes an integrated circuit mounted upon a medial portion of the printed wiring board and an optical subassembly. The optical subassembly includes a receptacle and an optoelectronic device, such as a light source or a detector. The receptacle generally defines an internal cavity for receiving the optoelectronic device and a pair of slots proximate the internal cavity. As such, the transmitter optical subassembly can be mounted to the printed wiring board so as to be at least partially disposed in the notch defined by the printed wiring board. In this regard, the respective arm portions of the printed wiring board are preferably inserted into the pair of slots defined by the receptacle in order to permit a portion of the optical subassembly to be disposed within the notch. As such, the path length between the optoelectronic device and the integrated circuit is effectively reduced, thereby correspondingly reducing circuit parasitics and improving the performance of the fiber optic interface module. Additionally, a method of fabricating a fiber optic interface module is provided.

20 Claims, 8 Drawing Sheets

OTHER PUBLICATIONS

Said F. Al–sarawi, Centre for High Performance Integrated Technologies and Systems (CHIPTEC), Adelaide, SA 5005, Mar. 1997.*

Hagge, J.K.; Camilletti, R.C. Advanced Packaging, IEEE Transactions on [see also Components, Packaging and Manufacturing Technology, Part B: Advanced Packaging, IEEE Transactions on], vol.: 22 Issue: 2, May 1999 Page(s): 145–152.*

Hagge, J. K.: Camilletti, R.C. Electronic Components & Technology Conference, 1998. 48th IEEE, 1998 Page(s): 889–894.*

Technical Data Sheet, *Boeing FDDI Transmitter And Receiver*, Jul. 1994.

Philippe Clot, Pierre Sarbach and Donald Styblo, *Chip On Board Technology For Low Cost Multi–Chip Modules, MCM 94 Proceedings*, pp. 455–460, 1994.

Patrick Thompson, *MCM–L Product Development Process For Low–Cost MCMs, MCM 94 Proceedings*, pp. 449–454.

Eric Y. Chan, Quynhgiao N. Le and Mark W. Beranek, *High Performance, Low–Cost Chip–On–Board (COB) FDDI Transmitter And Receiver For Avionics Applications, 48th Electronic Components & Technology Conference 1998 Proceedings*, pp. 410–417, May 25–28, 1998.

* cited by examiner

FIBER OPTIC INTERFACE MODULE AND ASSOCIATED FABRICATION METHOD

FIELD OF THE INVENTION

The present invention relates generally to fiber optic interface modules and associated fabrication methods and, more particularly, to fiber optic interface modules, including both fiber optic transmitter modules and fiber optic receiver modules, that are designed to maintain the high performance requirements demanded by avionics and other specialized applications in a more cost effective manner, as well as an associated fabrication method.

BACKGROUND OF THE INVENTION

Fiber Data Distributed Interface (FDDI) modules are used in a variety of applications. For example, modern commercial aircraft, such as the Boeing 777 aircraft, includes a number of FDDI modules, including both fiber optic receiver modules, fiber optic transmitter modules and fiber optic transceiver modules. In addition, FDDI modules are also utilized by a variety of less demanding commercial applications.

Typically, an FDDI module serves as a data link between stations of a local area network (LAN). In basic terms, an FDDI fiber optic receiver receives optical signals such as optical signals delivered by an optical fiber, and converts the optical signals into corresponding electrical signals that can then be processed or analyzed as desired. Conversely, an FDDI fiber optic transmitter receives electrical signals and converts the electrical signals into corresponding optical signals that are then typically launched through an optical fiber.

The fiber optic modules that are employed for avionics applications must meet high performance standards over a wide range of temperature and environmental conditions. In avionics applications, for example, the fiber optic transmitters must produce an output pulse that has well defined rising and falling edges and that has a shape as defined by a predetermined envelope over a large range of temperatures and other environmental conditions. The fiber optic receivers must also exhibit high performance characteristics, such as high sensitivity and high dynamic range and, in some instances, may have a sensitivity better than −34 dBm, over a wide range of temperatures and other environmental conditions. In this regard, the FDDI fiber optic modules must be capable of maintaining consistently high performance levels at any operating temperature from −55° C. to 110° C. and over a correspondingly wide range of humidity levels and other severe avionics environmental conditions. In addition, both the fiber optic transmitter modules and the fiber optic receiver modules must be capable of transmitting data at a high bit rate, such as at a rate of at least 125 megabits per second.

In order to meet the high performance requirements over the entire range of temperature and other environmental conditions, FDDI fiber optic modules that are designed for avionics and other specialized applications include a number of relatively expensive components, thereby driving up the overall cost of the FDDI fiber optic modules. For example, FDDI fiber optic modules that are designed for avionics applications typically include a ceramic substrate which is not only quite expensive, but which also demands relatively costly assembly procedures that further increase the cost of the resulting modules. The FDDI fiber optic modules that are designed for avionics applications also generally include a relatively expensive, gold plated, custom designed metal package which is capable of being hermetically sealed in order to protect the enclosed fiber optic module.

Additionally, avionics grade fiber optic receivers and transmitters typically include optoelectronic devices, such as light emitting diodes and the light sensitive detector diodes, that are custom made in order to fit within the package while providing the desired performance levels. The optoelectronic devices of conventional avionics grade fiber optic modules are expensive since, among other things, the optoelectronic devices generally are custom designed fiber pigtail packages which require active alignment of the optical fiber-to-the-optoelectronic device. In this regard, the optical fiber would have to be actively aligned to the light emitting diode of a fiber optic transmitter module or the light sensitive diode of a fiber optic receiver module. As will be apparent, a fiber pigtail package is relatively expensive since the preparation of the optical fiber and the alignment of the optical fiber are both time consuming and labor intensive. In addition, since the optoelectronic devices include attached pigtails, the optoelectronic devices must be more carefully handled during he manufacturing process in order to prevent the fiber pigtail from being broken.

The relatively high cost of the components of the FDDI fiber optic modules that are designed for avionics applications is exacerbated by the relatively low volume of the fiber optic modules. In this regard, the volume demand for avionics grade fiber optic modules generally ranges from a few modules per year to a thousand per year. This low volume stands in marked contrast to the fiber optic modules employed in other commercial applications that have volumes of many thousands per year. As a result of their relatively high cost, the avionics grade fiber optic modules therefore cannot effectively compete in the commercial market in an attempt to increase the sales volume and correspondingly decrease the price of the avionics grade fiber optic modules.

In an attempt to reduce the cost of avionics grade fiber optic modules, automatic alignment processes have been implemented to reduce the labor costs and time delays associated with the alignment of a fiber pigtail and an optoelectronic device. In addition, attempts have been made to increase the commonality of the components that form the fiber optic receiver modules and the fiber optic transmitter modules as well as to increase the commonality between the processes employed to fabricate the fiber optic receiver modules and the fiber optic transmitter modules. Unfortunately, these attempts have generally failed to significantly reduce the cost of the avionics grade fiber optic modules, primarily because the optoelectronic components remain quite expensive and since the fabrication process has neither a high yield nor a high throughput.

Accordingly, it would be desirable to provide lower cost FDDI modules, such as fiber optic receiver modules and fiber optic transmitter modules, that meet or exceed the high performance requirements demanded by avionics and other specialized applications over a wide range of temperatures and other environmental conditions. While conventional fiber optic interface modules that are designed for avionics and other specialized applications have excellent performance characteristics over a wide range of temperatures and other environmental conditions, these fiber optic interface modules remain quite expensive, thereby effectively limiting their use in other commercial applications that need not be designed to withstand such severe environmental conditions.

SUMMARY OF THE INVENTION

According to the present invention, more cost-effective fiber optic interface modules, such as fiber optic transmitter modules and fiber optic receiver modules, are provided that meet the high performance requirements demanded by avionics and other specialized applications over a wide range of temperatures and other environmental conditions. In this regard, the fiber optic interface module of the present invention includes a greater number of commercial components that are capable of being assembled according to newly developed commercial fabrication techniques such that the cost of the resulting fiber optic interface modules are significantly reduced relative to conventional avionics grade fiber optic interface modules, i.e., the fiber optic interface module of the present invention has a greater performance-to-cost ratio. Additionally, a method of fabricating a fiber optic interface module is provided according to another aspect of the present invention.

In one embodiment, a fiber optic transmitter module is provided that includes a printed wiring board defining a notch in at least one edge thereof. In this regard, the printed wiring board generally includes a pair of arm portions that extend outwardly and define the opposed edges of the notch. The printed wiring board typically includes a substrate and electrical traces defined thereupon. The fiber optic transmitter module also includes an integrated circuit mounted upon a medial portion of the printed wiring board such that the printed wiring board mechanically supports the integrated circuit. Among other components, the integrated circuit of the fiber optic transmitter module includes a driver circuit for providing the drive current.

The fiber optic transmitter module also includes a transmitter optical subassembly including a receptacle and a light source, such as a light emitting diode, that is responsive to the driver circuit for transmitting signals in response to the drive current. In one advantageous embodiment, the receptacle defines an internal cavity for receiving the light source and a pair of slots proximate the internal cavity. According to the present invention, the transmitter optical subassembly is mounted to the printed wiring board so as to be at least partially disposed in the notch defined by the printed wiring board. In this regard, the respective arm portions of the printed wiring board are preferably inserted into the pair of slots defined by the receptacle in order to permit a portion of the transmitter optical subassembly to be disposed within the notch. As such, the path length between the light source and the integrated circuit is effectively reduced, thereby correspondingly reducing circuit parasitics and improving the performance of the fiber optic transmitter module.

Both the light source and the integrated circuit are preferably electrically connected to the same electrical trace that has a path length selected such that the circuit parasitic capacitance and inductance are minimized, typically such that the total circuit parasitics are less than 2 picofarads. For example, both the light source and the integrated circuit are preferably electrically connected to the same impedance (e.g., 50 ohm) matched electrical trace that defines a linear path across the printed wiring board (PWB). In addition, the electrical leads by which the light source connects to the (50 ohm) impedance matched electrical trace on the printed wiring board preferably has a path length that is no greater than 2 millimeters. As a result of the short, straight electrical path, circuit parasitics are substantially reduced. Using the method of the current invention, the electrical leads from the light source are soldered directly on the (50 ohm) impedance matched electrical traces without wire bonding, therefore eliminating the parasitic inductance associated with the bond wires.

A fiber optic receiver module is also provided according to another embodiment of the present invention. The fiber optic receiver module also includes a printed wiring board defining a notch in at least one edge thereof. Typically, the printed wiring board includes a pair of outwardly extending arm portions that define the opposite edges of the notch. The fiber optic receiver module also includes an integrated circuit mounted upon a medial portion of the printed wiring board. Among other components, the integrated circuit includes an amplifier for amplifying signals received by the fiber optic receiver module.

The fiber optic receiver module also includes a receiver optical subassembly having a receptacle and a detector, such as a light sensitive diode. Typically, the receptacle defines an internal cavity for receiving the detector and a pair of slots proximate the internal cavity. Like the transmitter optical subassembly, the receiver optical subassembly is mounted to the printed wiring board so as to be at least partially disposed in the notch defined by the printed wiring board. In this regard, the receiver optical subassembly is mounted such that the pair of arm portions extend into the slots defined by the receptacle in order to permit portions of the receiver optical subassembly to be disposed within the notch. As such, the path length between the detector and the integrated circuit is reduced and the circuit parasitics are correspondingly reduced.

As also described above in conjunction with the fiber optic transmitter module, the fiber optic receiver module is preferably designed such that both the detector and the integrated circuit are electrically connected via an impedance matched (e.g., 50 ohm) electrical trace that has a relatively short, collective path length such that the circuit parasitic capacitance are minimized, typically such that the total circuit parasitics are no greater than 2 picofarads. In this regard, the (50 ohm) impedance matched electrical trace(s) to which the detector and the integrated circuit are electrically connected typically defines a linear path across the printed wiring board. In addition, the electrical leads by which the detector connects to the impedance (e.g., 50 ohm) matched electrical traces on the printed wiring board is no greater than 2 millimeters. By establishing an electrical connection along a relatively short, straight electrical path, the fiber optic receiver module also reduces the circuit parasitics. Using the method of the current invention, the electrical leads from the detector are soldered directly on the impedance (50 ohm) matched electrical traces without wire bonding, therefore eliminating the parasitic inductance associated with the bond wires.

According to these embodiments of the present invention, a fiber optic transmitter module and a fiber optic receiver module are provided that can be fabricated with more lower cost, commercial off the shelf components and assembly equipment, while still providing the high performance over the wide range of temperatures and other environmental conditions that is demanded for avionics and other highly specialized applications. In this regard, the printed wiring board is specifically designed to define a notch between a pair of arm portions such that the respective optical subassembly can be at least partially mounted within the notch in order to reduce the path length of the electrical trace that extends between the optical subassembly and the integrated circuit. As such, the circuit parasitics are correspondingly reduced, thereby permitting the fiber optic transmitter module or the fiber optic receiver module to operate at relatively high speeds and to demonstrate a relatively high performance level over a wide range of temperatures and other environmental conditions even though the cost of the fiber optic transmitter module or the fiber optic receiver module is significantly less than conventional avionics grade fiber optic interface modules. Accordingly, the fiber optic transmitter module and the fiber optic receiver module have a larger performance-to-cost ratio than conventional designs.

According to another aspect of the present invention, a method of fabricating a fiber optic interface module, such as a fiber optic transmitter module or a fiber optic receiver module, is provided. Initially, a printed wiring board, such as a laminated printed wiring board, is provided with a U-shaped notch defined in at least one edge thereof. In addition, the printed wiring board can include outwardly extending arm portions on opposite sides of the notch.

An optical subassembly is then mounted to the printed wiring board so as to be at least partially disposed in the notch defined by the printed wiring board. In order to position a portion of the optical subassembly in the notch, the arm portions of the printed wiring board are preferably inserted into slots defined by the receptacle of the optical subassembly. In order to further reduce the manufacturing costs of the fiber optic interface module, the optical subassembly is preferably mounted to the printed wiring board by surface mount technology. In this regard, the optical subassembly is surface mounted to the printed wiring board and the leads of the optical subassembly are soldered to establish electrical contact with the electrical traces disposed upon the printed wiring board. Alternatively, the optical subassembly can be mounted to the printed wiring board by means of plated through holes defined by the printed wiring board.

An integrated circuit is then mounted upon a medial portion of the printed wiring board. In instances in which the fiber optic interface module is a fiber optic transmitter module, the integrated circuit is a transmitter integrated circuit having a driver circuit for providing a drive current. Alternatively, in instances in which the fiber optic interface module is a fiber optic receiver module, the integrated circuit is a receiver integrated circuit-having an amplifier for amplifying signals that are received by the fiber optic interface module. Irrespective of the type of integrated circuit, however, the integrated circuit is preferably mounted to the printed wiring board by adhesively bonding the integrated circuit to the printed wiring board. In addition, electrical connection by wire bonds can be established between the integrated circuit and wire bonding pads disposed upon the printed wiring board.

Accordingly, the method of this aspect of the present invention permits fiber optic interface modules to be fabricated with lower cost components that are assembled by newly developed manufacturing techniques that are more cost effective, while still providing the high speed and desired performance over the wide range of temperatures and other environmental conditions demanded for avionics and other specialized applications. For example, the fiber optic transmitter and receiver modules and the fabrication method of the present invention typically include commercial-grade optical subassemblies that are mounted to laminated printed wiring board in order to reduce the cost of the resulting fiber optic interface module. In addition, surface mount technology and wire bonding techniques are preferably employed in order to reduce the fabrication costs. By specifically designing the printed wiring board to define a notch in which the optical subassembly is at least partially disposed, however, the path length of the electrical trace between the optical subassembly and the integrated circuit is reduced, relative to conventional designs, thereby correspondingly reducing the circuit parasitics. As such, the fiber optic interface module of the present invention can perform at least as well as the conventional avionics grade fiber optic interface modules over the wide range of temperatures and other environmental conditions demanded by avionics and other specialized applications even though the fiber optic interface modules of the present invention are much less expensive.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
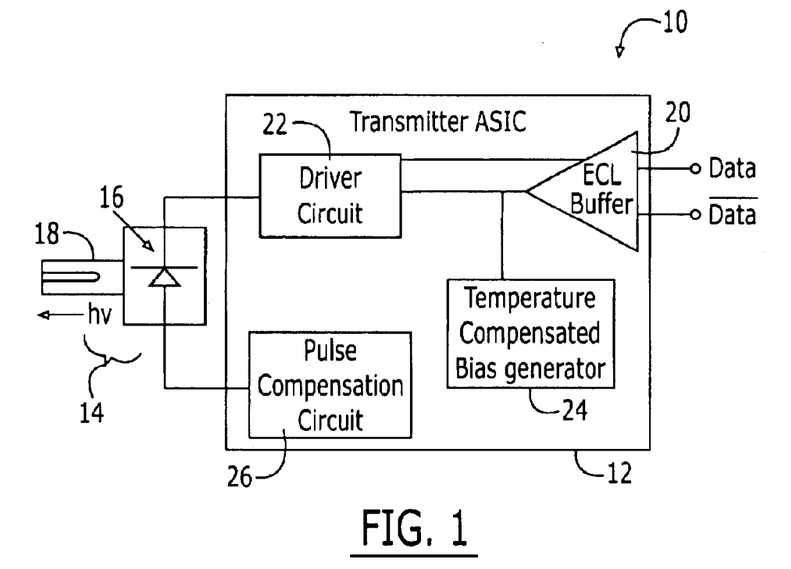
FIG. 1 is a block diagram of a fiber optic transmitter module according to one advantageous embodiment of the present invention.

Referring now to FIG. 1, the fiber optic transmitter module 10 of one aspect of the present invention is schematically illustrated in block diagram form. In general terms, the fiber optic transmitter module includes an integrated circuit 12 for receiving electrical input signals and for transforming the electrical input signals into an appropriate drive current. Typically, the integrated circuit is an application specific integrated circuit (ASIC). The fiber optic transmitter module also includes a transmitter optical subassembly 14. Unlike conventional avionics grade fiber optic transmitter modules that include custom-made optoelectronic devices, the transmitter optical subassembly of the fiber optic transmitter module of the present invention is preferably a much lower cost commercial off the shelf optical subassembly.

The transmitter optical subassembly 14 can include a light source 16, such as a light emitting diode, for emitting optical signals in response to electrical input signals that are received by the fiber optic transmitter module 10. While the transmitter optical subassembly can include different types of light emitting diodes, the light emitting diode of one advantageous embodiment is a surface emitting light emitting diode that emits light having a wavelength of 1.3 microns. The transmitter optical subassembly also includes a receptacle. As described below, the receptacle generally provides a housing in which the light source is disposed as well as a connector 18 for mating with a corresponding connector mounted upon the end portion of an optical fiber. As shown schematically in FIG. 1, receptacle can include a bayonet-style connector. However, the receptacle can include other types of connectors, if so desired.

In order to appropriately drive the light source 16, the associated integrated circuit 12 converts the electrical input signals, designated Data and $\overline{\text{Data}}$ in FIG. 1, to appropriate levels of drive current that are, in turn, provided to the light source. As shown in FIG. 1, the integrated circuit generally includes an emitter-coupled-logic (ECL) input buffer 20 for receiving electrical input signals designated Data and $\overline{\text{Data}}$ that are typically in the form of a digital stream of bits. As will be apparent, the input signals Data and $\overline{\text{Data}}$ are inverses of one another. The integrated circuit also typically includes a driver circuit 22. The driver circuit receives input signals from the ECL input buffer and provides the desired drive current to the light source.

As shown in FIG. 1, the integrated circuit 12 also includes a temperature compensation bias generator 24 for controllably altering the drive current in response to temperature variations such that the driver circuit 22 provides a desired or predetermined-drive current as the temperature fluctuates through a predetermined temperature range, such as −55° C. to 110° C. Thus, the temperature compensation bias generator provides an output that is dependent upon the temperature that is then combined with the output of the ECL input buffer 20. The combined signals from the ECL buffer and the temperature compensation bias generator are provided to the driver circuit which, in turn, provides a consistent drive current to the light source 16 even as the temperature fluctuates. Since light sources, such as light emitting diodes, will typically emit different levels of light in response to the same drive current when exposed to different temperatures, the temperature compensation bias generator is designed to alter the input signals provided to the driver circuit and, in turn, to alter the drive current provided by the driver circuit to the light source as the temperature varies such that the light emitted by the light source is constant throughout the entire range of operating temperatures, such as −55° C. to 110° C. In addition, the integrated circuit 12 can include a pulse compensation circuit 26 that is electrically connected to the light source 16 for controllably altering the intrinsic rise and fall time characteristics of the light source such that a resulting optical pulse waveform has the desired shape.

While the integrated circuit 12 of the fiber optic transmitter module 10 can be designed in a number of different manners, the fiber optic transmitter module of one advantageous embodiment is the same as the integrated circuit employed by the conventional ARINC 636 FDDI fiber optic transmitter module that is manufactured by The Boeing Company of Seattle, Wash. As such, additional details regarding the performance of the fiber optic transmitter module are provided by a technical data sheet entitled "Boeing FDDI Transmitter and Receiver" (July 1994).

Figure 2:
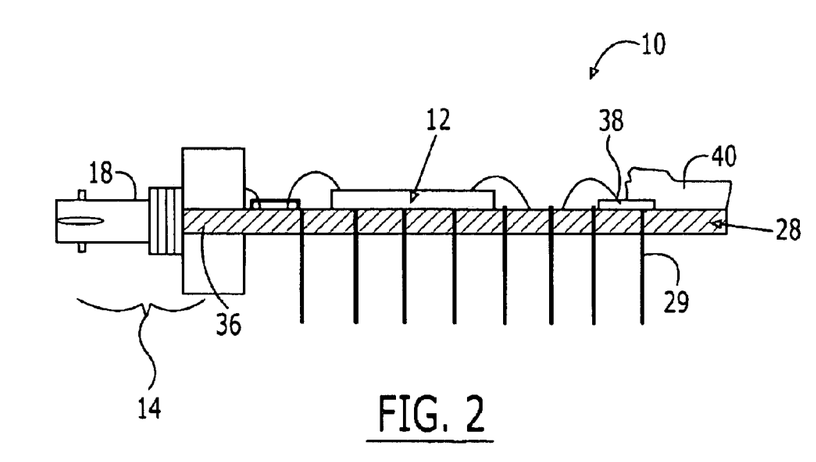
FIG. 2 is a schematic side view of a fiber optic transmitter module according to one advantageous embodiment of the present invention.

As shown in FIG. 2, the fiber optic transmitter module 10 also includes a printed wiring board 28 upon which the integrated circuit 12 and the transmitter optical subassembly 14 are mounted. Preferably, the printed wiring board is a laminated printed wiring board that includes a substrate and a plurality of electrical traces and wire bonding pads disposed upon the substrate. While the substrate can be formed of a variety of materials including newly developed materials such as aramid fiber with low thermal expansion bismaleimide triazine (BT) epoxy resin and cyanate ester, the substrate is typically formed of FR-4 which is a commercially available glass epoxy.

Figure 3:
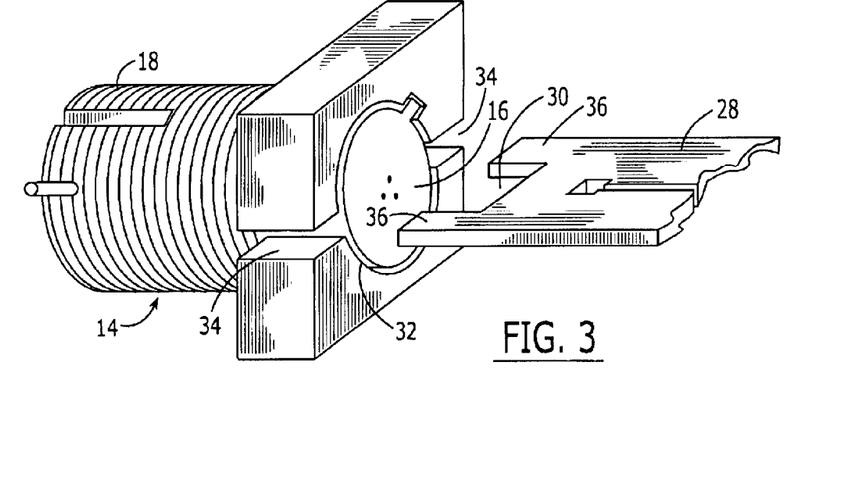
FIG. 3 is an exploded perspective view of the circled portion of the fiber optic transmitter module of FIG. 2 depicting the notch defined by the printed wiring board and the transmitter optical subassembly.

According to the present invention, the printed wiring board 28 having a number of module leads 29 defines a notch 30 in at least one edge thereof as shown in more detail in FIG. 3. As such, the transmitter optical subassembly 14 is mounted to the printed wiring board so as to be at least partially disposed within the notch defined by the printed wiring board. In this regard, the transmitter optical subassembly is preferably mounted to the printed wiring board such that the light source is disposed within a central portion of the notch and the connector 18 extends outwardly from the printed wiring board in order to mate with a connector mounted upon an end portion of an optical fiber. In more detail, the receptacle housing preferably defines an internal cavity 32 in which the light source is disposed. In addition, the receptacle housing preferably defines a pair of slots 34 proximate to the internal cavity. While the slots are shown to open into the internal cavity, the slots can be spaced slightly from the internal cavity, if so desired. Correspondingly, the edge of the printed circuit board that defines the notch preferably includes a pair of outwardly extending arm portions 36 that define the opposite sides of the notch. As such, the transmitter optical subassembly is preferably mounted to the printed circuit board such that the arm portions of the printed wiring board are inserted into the slots defined by the receptacle housing while the light source and at least a portion of the receptacle housing are disposed within the notch as shown in FIG. 2.

In order to reduce the cost of manufacturing the fiber optic transmitter module 10, the transmitter optical subassembly 14 is preferably mounted to the printed wiring board 28 with surface mount technology. In this regard, solder paste or epoxy can be applied to the arm portions 36 of the printed wiring board and the solder can be reflowed after the transmitter optical subassembly has been mounted at least partially within the notch 30 defined by the printed wiring board such that the arm portions of the printed wiring board are soldered or epoxied within the slots defined by the receptacle housing. The leads of the light source can also be concurrently soldered to respective electrical traces or respective bonding pads that are disposed upon the printed wiring board. The light source can alternatively be connected to the traces on the printed wiring board by a plated through hole technique in which the printed wiring board defines plated through holes. Typically, the surface mount technique is preferred with respect to both performance and manufacturing aspects since surface mounted leads allow for a higher density layout as well as facilitating part placement during assembly.

As shown in FIG. 2, the integrated circuit 12 is preferably mounted upon a medial portion of the printed wiring board 28 such that the printed wiring board mechanically supports and protects the integrated circuit. In order to reduce the manufacturing costs of the fiber optic transmitter module 10 of the present invention, the integrated circuit is preferably bonded to the printed wiring board by means of an adhesive. In addition, the leads of the integrated circuit are preferably connected to respective wire bonding pads disposed upon the printed wiring board by means of wire bonds.

Since the transmitter optical subassembly 14 and, in particular, the light source 16 is disposed at least partially within a notch 30 defined by the printed wiring board 28, the light source is physically closer to the integrated circuit 12 than in conventional fiber optic transmitter modules of a like size or footprint. As such, the performance of the fiber optic transmitter module, such as the speed and the precision of the optical pulse waveforms, is enhanced since the circuit parasitics are reduced due to the close proximity of the transmitter optical subassembly and the integrated circuit. In this regard, respective leads of both the light source and the integrated circuit are preferably electrically connected to the same electrical trace that has a path length selected such that circuit parasitics are minimized, typically such that the total circuit parasitics are no greater than 2 picofarads. In one advantageous embodiment, respective leads of both the light source and the integrated circuit are electrically connected to the same impedance matched electrical trace, such as a 50 ohm trace. Since the lead length of the light source (LED) is no greater than 2 millimeters, circuit parasitics are limited. Moreover, the electrical trace that interconnects the respective leads of both the light source and the integrated circuit preferably defines a linear path across the substrate in order to further limit the circuit parasitics. By limiting the path length of the electrical trace and the lead length of the light source, the circuit parasitics are minimized and the performance of the fiber optic transmitter module 10 of the present invention is correspondingly enhanced.

In addition to the transmitter optical subassembly 14 and the integrated circuit 12, the fiber optic transmitter module 10 can include a number of passive components 38, such as capacitors and the like. These passive components generally serve to condition the electrical input signals to the light source. In particular, the passive components typically form the pulse and temperature compensation circuit which condition the drive current coming from the transmitter ASIC to the LED. The pulse and temperature compensation circuits assure the optical pulse signal output from the LED meets the speed and power requirements, such as the ARINC 636 specifications over the operating temperature range of −40° C. to 110° C. Like the transmitter optical subassembly, the passive components are typically mounted to the printed wiring board 28 by a surface mount technique and the leads of the passive components are soldered to respective electrical traces or bonding pads. As described above in conjunction with the integrated circuit, the passive components are typically the same as the passive components of a conventional ARINC 626 FDDI fiber optic transmitter module. As such, further details regarding the passive components of the fiber optic transmitter module are provided by the technical data sheet entitled "Boeing FDDI Transmitter and Receiver."

The fiber optic transmitter module 10 also generally includes a protective coating 40 that encapsulates at least portions of the printed wiring board, the integrated circuit 12 and the passive components 38. For purposes of illustration, only a portion of the protective coating is depicted in FIG. 2 with the remainder of protective coating being removed to more clearly depict the components mounted upon the printed wiring board. While the fiber optic transmitter module can include various types of protective coatings, the fiber optic transmitter module of one advantageous embodiment includes a single layer of an organic "glob top" coating that provides adequate moisture, handling and contamination protection. "Glob top" generally refers to the category of organic encapsulants, including epoxy, polyurethane and silicone. These coatings are commercially offered by several encapsulant manufacturers, including Dow Chemical Co., Hysol and W. R. Grace Co. Alternatively, the fiber optic transmitter module can include a conformal coating such as silicon nitride, silicon oxide, vapor deposited parylene or a combination thereof. Still further, in instances in which the fiber optic transmitter module will be installed in relatively harsh environments and will likely experience high temperatures. The fiber optic transmitter module can include a metal enclosure, typically formed of aluminum or kovar, for shielding the printed wiring board and the components mounted thereupon from radiation and/or electromagnetic interference (EMI).

In addition to the fiber optic transmitter module 10, the present invention also provides a fiber optic receiver module 50 that is similar to the fiber optic transmitter module in many respects. As such, those components of the fiber optical receiver module 10 that are substantially identical to corresponding components of the fiber optic transmitter module will not be described in as much detail in conjunction with the fiber optic receiver module in order to focus the discussion upon those components that are unique to the fiber optic receiver module.

Figure 4:
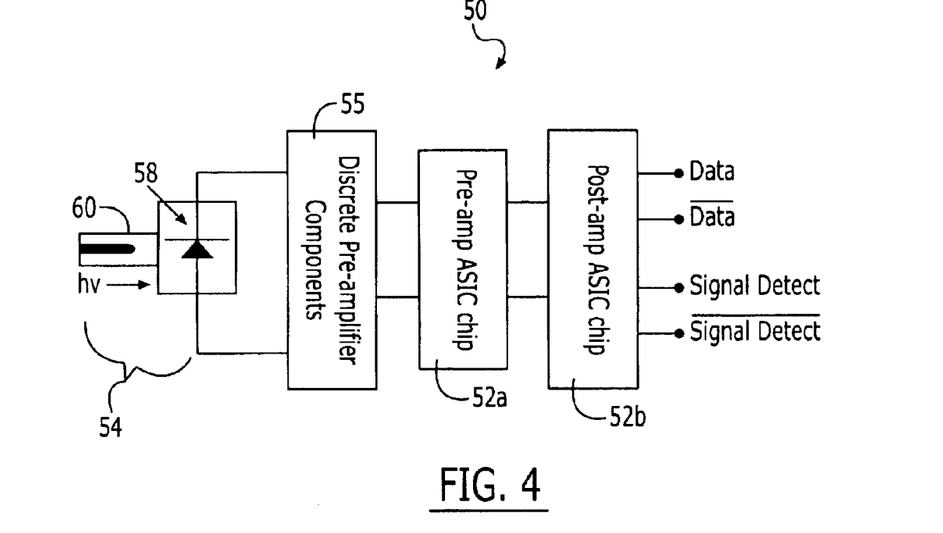
FIG. 4 is a block diagram of a fiber optic receiver module according to one advantageous embodiment of the present invention.

As shown in FIG. 4, the fiber optic receiver module 50 includes at least one integrated circuit 52 and a receiver optical subassembly 54 that is electrically connected to the integrated circuit. As shown in FIG. 4, the fiber optic receiver module typically includes a pair of integrated circuits, both of which are preferably ASICs. In particular, the fiber optic receiver module preferably includes a preamp integrated circuit 52a and a postamp integrated circuit 52b. In addition to the integrated circuits and the receiver optical subassembly, the fiber optic receiver module preferably includes a number of discrete components 55 disposed between the receiver optical subassembly and the preamp integrated circuit in order to appropriately condition and qualify the signals provided by the receiver optical subassembly to the preamp integrated circuit in order to avoid saturating the amplifier.

In operation, the receiver optical subassembly 54 receives optical signals and produces electrical signals having current levels related to the received optical signals. The discrete components 55 receive the electrical signals from the receiver optical subassembly and adjust the gain and otherwise provide gain control in order to provide electrical signals of the appropriate level to the preamp and postamp integrated circuits 52a, 52b, thereby avoiding saturation of the amplifier. The preamp integrated circuit converts the current provided by the receiver optical subassembly and conditioned by the discrete components into a corresponding voltage level that is, in turn, provided to the postamp integrated circuit. The postamp integrated circuit typically includes the amplifier as well as components that process the output of the amplifier to insure that the resulting electrical signals have the appropriate logic level and define a pulse of the proper shape and voltage level. As shown in FIG. 4, the postamp integrated circuit therefore provides an electrical signal corresponding to the received optical signal (designated Data) as well as its inverse (designated $\overline{\text{Data}}$). In addition, the postamp integrated circuit provides signals identified as Signal Detect and $\overline{\text{Signal Detect}}$, that are indicative of whether or not an optical signal has been received by the receiver optical subassembly.

Much like the integrated circuit 12 and passive components 38 of the fiber optic transmitter module 10, the discrete components 55, the preamp integrated circuit 52a and the postamp integrated circuit 52b are generally substantially the same as, if not identical to, the corresponding elements of a conventional ARINC 636 FDDI fiber optic receiver module. As such, further details regarding the performance of the ARINC 636 receiver is provided by the technical data sheet entitled "Boeing FDDI Transmitter and Receiver."

As also shown schematically in FIG. 4, the receiver optical subassembly 54 includes a receptacle 56 and a detector 58. As described in conjunction with the fiber optic transmitter module 10 and as depicted in FIG. 3, the receptacle generally includes a housing that defines an internal cavity in which the detector is disposed as well as a connector 60, such as a bayonet-style connector, for mating with a corresponding connector mounted upon the end portion of an optical fiber. While the receiver optical subassembly can include a variety of detectors, the detector of one embodiment is a light sensitive diode and, most commonly, is an InGaAs PIN diode that is designed to receive optical signals having a wavelength of 1.3 microns. In addition, as described above in conjunction with the transmitter optical subassembly 14, the receiver optical subassembly can be a commercial off the shelf optical subassembly in order to significantly reduce the cost of the fiber optic receiver module in comparison to conventional avionics grade fiber optic receiver modules.

Figure 5:
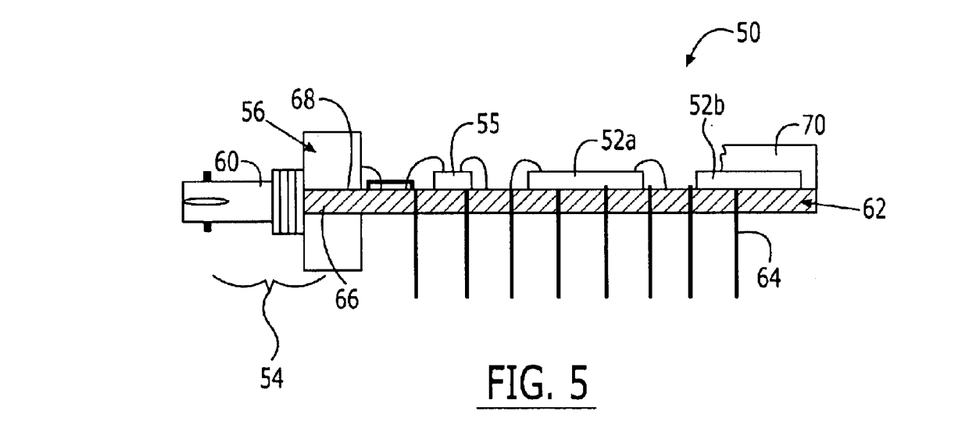
FIG. 5 is a schematic side view of a fiber optic receiver module according to one advantageous embodiment of the present invention.

As shown in FIG. 5, the fiber optic receiver module 50 also includes a printed wiring board 62 consisting of a substrate, typically formed of FR-4, a plurality of electrical traces and wire bonding pads disposed thereon, and a plurality of module leads 64. The printed wiring board also defines a notch in at least one edge thereof. As such, the receiver optical subassembly 54 is at least partially disposed in the notch defined by the printed wiring board. In this regard, the edge of the printed wiring board that defines the notch preferably includes a pair of arm portions 66 that extend outwardly to form opposite sides of the notch. Correspondingly, the receptacle housing preferably defines a pair of slots 68 proximate the internal cavity. See FIG. 3. As such, the receiver optical subassembly can be mounted to the edge of the printed wiring board such that the arm portions are received by respective slots defined by the receptacle housing, while the detector as well as at least a portion of the receptacle housing are disposed within the notch defined by the printed wiring board. In order to further reduce the cost of the fiber optic receiver module of the present invention, the receiver optical subassembly is typically mounted to the printed wiring board by surface mount technology and the leads of the detector 58 are generally soldered to respective electrical traces or bonding pads, as described below. Alternatively, the printed wiring boards can define plated through holes such that the receiver optical subassembly is mounted thereto via the plated through holes.

Since the receiver optical subassembly 54 is advantageously disposed at least partially within the notch defined by the printed wiring board 62, the detector 58 is physically and electrically closer to the other electrical components, such as the discrete components 55 and the integrated circuits 52, thereby decreasing the path length and correspondingly reducing circuit parasitics. As such, the fiber optic receiver module 50 of the present invention preferably demonstrates consistently high performance, including fast speed and high sensitivity. In this regard, the sensitivity of the fiber optic receiver module is preferably better than −34 dBm.

The respective leads of both the detector 58 and the integrated circuit 52 are electrically connected to the electrical traces upon the printed wiring board 62 with the cumulative path length of the traces and the configuration of the traces selected such that the circuit parasitics are minimized, typically such that the total circuit parasitics are less than 2 picofarads. In order to reduce the circuit parasitics, the respective leads of both the detector and integrated circuits are preferably electrically connected to impedance matched electrical traces. Preferably, the lead length of the electrical leads that connect the detector to the impedance matched traces is no greater than 2 millimeters. In addition, the respective leads of both the detector and the integrated circuits are also preferably electrically connected to electrical traces that cooperate to define a linear path across the substrate. As such, even though the integrated circuits and the discrete components 55 are mounted upon medial portions of the printed wiring board, the receiver optical subassembly 54 can be disposed relatively near to the front-end components by mounting the receiver optical subassembly at least partially within the notch defined by one edge of the printed wiring board. As such, the circuit parasitics of the fiber optic receiver module are relatively low and the high performance of the fiber optic receiver module is optimized.

As also described above in conjunction with the fiber optic transmitter module 10, the fiber optic receiver module 50 can also include a protective coating 70 that encapsulates at least portions of the printed wiring board 62, the integrated circuits 52 and the discrete components 55. For purposes of illustration, only a portion of the protective coating is depicted in FIG. 5 with the remainder of protective coating being removed to more clearly depict the components mounted upon the printed wiring board. For example, the protective coating can be single layer of an organic "glop top" coating or layers of silicon nitride, silicon oxide, vapor deposited parylene or combinations thereof. Alternatively, the fiber optic receiver module can include a metal enclosure, typically formed of aluminum, if the fiber optic receiver module is to be deployed in applications requiring shielding from radiation and/or EMI.

Figure 6A:
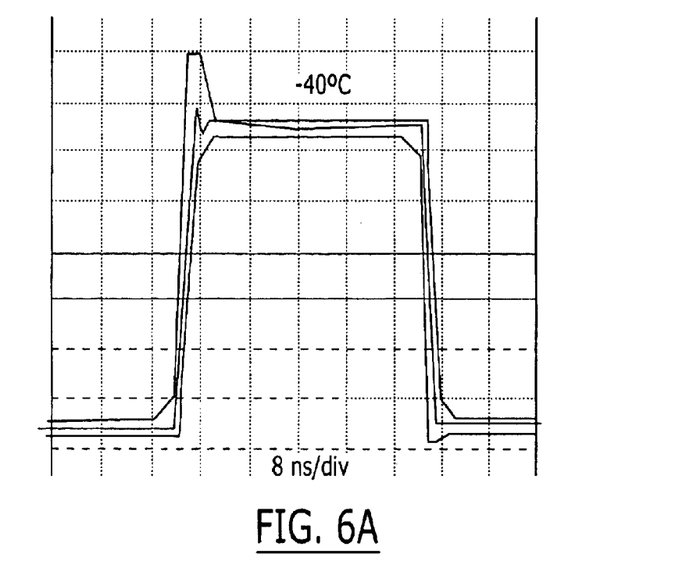
FIGS. 6A, 6B, and 6C are waveforms illustrating the performance of a fiber optic transmitter module according to one embodiment of the present invention at −40° C., 23° C. and 110° C., respectively.
Figure 6B:
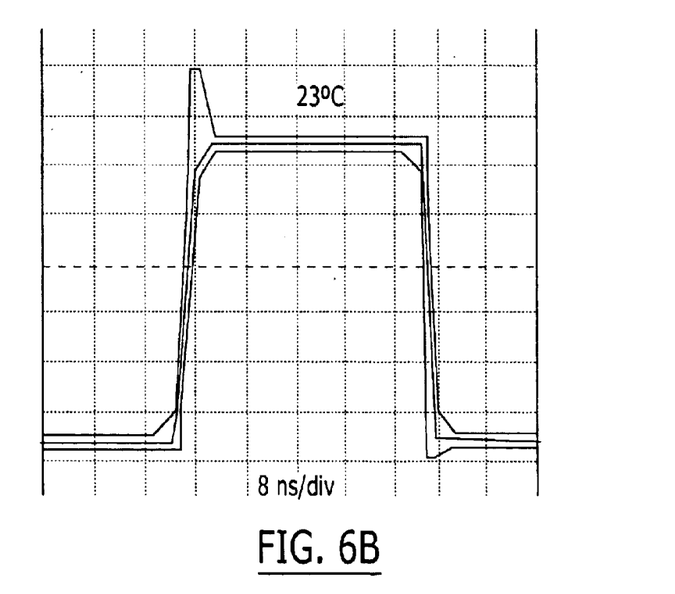
Figure 6C:
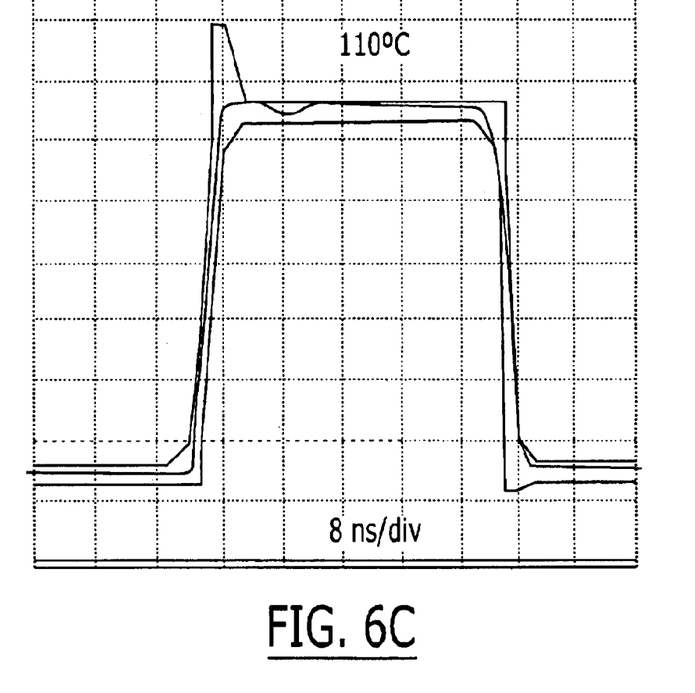

As described above, the fiber optic transmitters and receiver modules of the present invention maintain the high performance levels of conventional FDDI fiber optic modules, even though the fiber optic transmitter and receiver modules of the present invention are significantly less expensive. By way of example of the performance of the fiber optic transmitter module, FIGS. 6A–6C illustrate the output waveform of a fiber optic transmitter module according to the present invention at −40° C., 23° C. and 110° C. respectively. Each of these figures also illustrate the envelope in which the waveform should fall and, as depicted, each of the output waveforms of the fiber optic transmitter module lie within the respective envelopes. In addition, the exemplary fiber optic transmitter module of the present invention has also been found to have a minimum average output power of about −14 dBm over the temperature range of −55° C. to 110° C. which is about 6 dB better than standard commercial grade FDDI transmitters. Furthermore, the bit-error rate (BER) of the fiber optic transmitter module of the present invention has been demonstrated to be less than 2E−10 when tested with the standard FDDI PMD 4B5B NRZI encoded symbol pattern. As such, while the fiber optic transmitter module of the present invention generally costs significantly less to manufacture than conventional avionics grade fiber optic transmitter modules as described below, the fiber optic transmitter module of the present invention has similar performance characteristics in regards to the speed at which the fiber optic transmitter module operates and the quality of the signals produced by the fiber optic transmitter module.

Figure 7A:
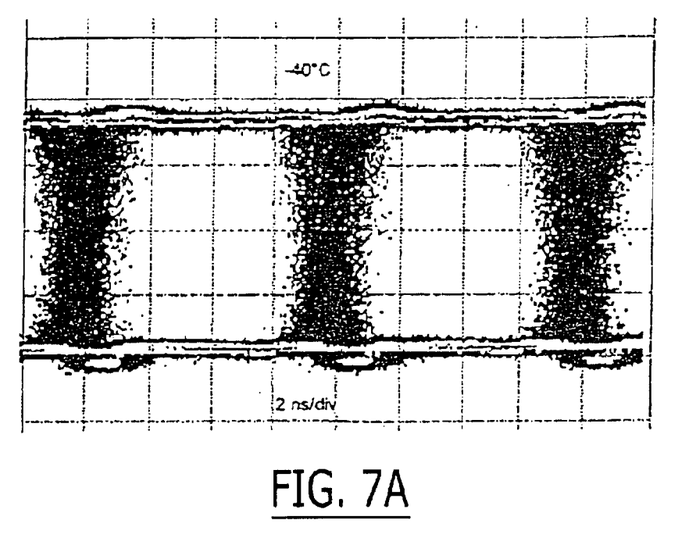
FIGS. 7A, 7B, and 7C are waveforms illustrating the performance of a fiber optic receiver module according to one embodiment of the present invention at −40° C., 23° C. and 110° C., respectively.
Figure 7B:
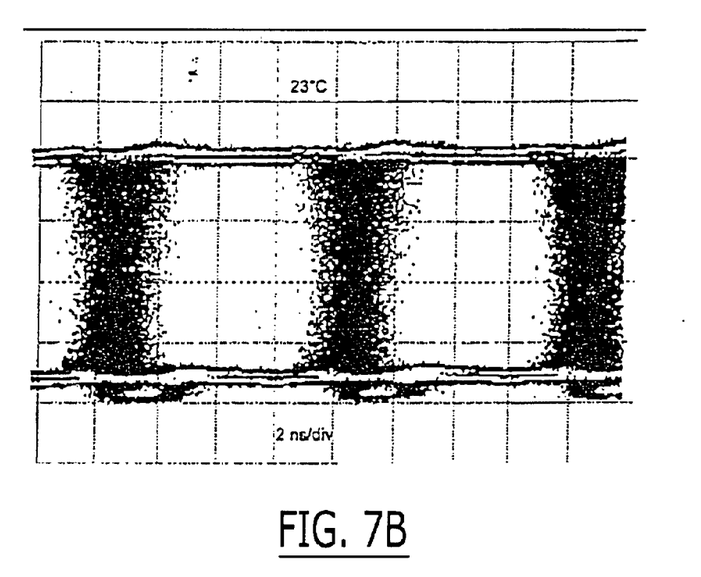
Figure 7C:
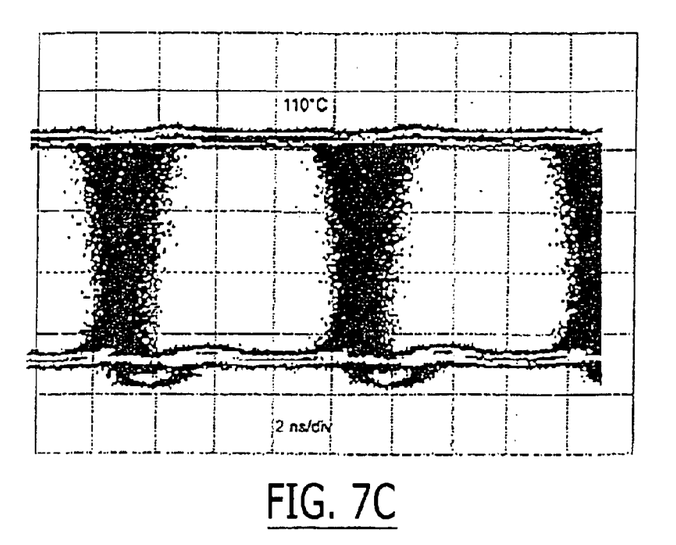

As described above, the fiber optic receiver module 50 of the present invention is also capable of maintaining the high performance requirements of avionics grade FDDI fiber optic receiver modules. In this regard, FIGS. 7A–7C depict eye diagrams of the receiver at −40° C., 23° C and 110° C., respectively. As known to those skilled in the art, an eye-diagram is the overlapping waveform trace of the random "1" and "0" digital pattern with a wide opening eye-diagram representing good receiver performance. As depicted, the eye-width exceeds 5.3 nanoseconds at −34.5 dBm average input optical power. In addition, the fiber optic receiver module of the present invention has demonstrated a sensitivity better than −42 dBm at the eye-center. While the receiver peak sensitivity is near −42 dBm, the dynamic range of the fiber optic receiver module is over 25 dB for temperatures between −55° C. and 110° C. Accordingly, while the fiber optic receiver module of the present invention is capable of being manufactured at significantly less cost than conventional avionics grade FDDI fiber optic receiver modules, the fiber optic receiver module of the present invention is capable of meeting the same high performance requirements as demanded of avionics grade fiber optic receiver modules with respect to the data rate and sensitivity, among other parameters.

According to the present invention, a method of fabricating the fiber optic interface module, such as a fiber optic transmitter module 10 or a fiber optic receiver module 50, is also provided. As described in some detail above, the fabrication method of the present invention attempts to utilize at least some commercial off the shelf components along with lower cost assembly techniques, some of which have only recently been developed, in order to produce a fiber optic interface module that meets the high performance requirements demanded for avionics and other specialized applications, but that can be manufactured at a significantly lower cost.

Figure 8:
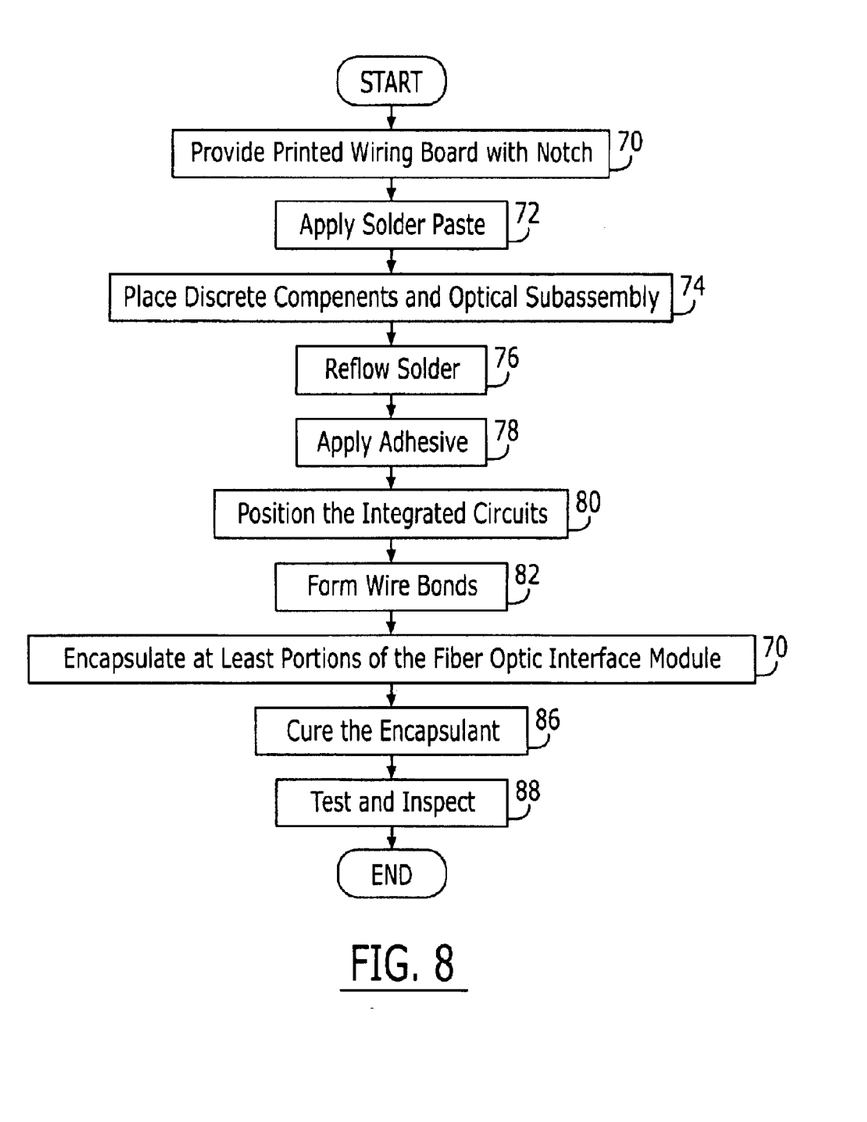
FIG. 8 is a flow chart illustrating the operations performed during the fabrication of a fiber optic interface module according to another aspect of the present invention.

As shown in block 70 of FIG. 8, a printed wiring board is initially provided that defines a notch in at least one edge thereof. As described above, the printed wiring board is typically a laminated printed wiring board formed FR-4. However, the laminated printed wiring board can be formed by other materials, including aramid fiber with low thermal expansion bismaleimide triazine epoxy resin and cyanate ester.

While the substrate can be sized as appropriate for the application, the substrate of one embodiment is approximately 0.5"×1" and has a thickness of 0.035". According to this embodiment, the notch is therefore generally sized to be approximately 0.25" in width. However, the notch can be sized bigger or smaller if so desired, so long as at least a portion of the optical subassembly can be disposed therein.

Regardless of the size and material, the printed wiring board includes a substrate with electrical traces and wire bonding pads disposed thereupon. Typically, the electrical traces are defined upon the substrate according to standard design rules such that the line width and spacing of the traces is 0.010". However, the electrical traces should be designed to provide impedance matching for the high frequency signal lines. In addition, although the electrical traces can be formed of different combinations of materials, the electrical traces of one embodiment are formed of layers of tin and lead. In contrast, wire bonding pads are typically formed of a soft gold deposited over a nickel layer. In addition to the electrical traces and the wire bonding pads, the printed wiring board can define one or more via holes, each typically having a diameter of about 0.010".

A number of components are then mounted upon the printed wiring board by surface mount technology. In this regard, the discrete components and the optical subassembly of the fiber interface module are typically mounted upon a printed wiring board by surface mount technology. In order to do so, a solder paste, such as a standard eutectic tin/lead solder, is applied to appropriate portions of the printed wiring board, including the arm portions of the printed wiring board that define the opposite edges of the notch. See block 72. Thereafter, the discrete components and the optical subassembly are placed in position, such as by an automatic pick and place machine, and the solder is then reflowed to bond the optical subassembly and the discrete components to the printed wiring board. See blocks 74 and 76. Along with soldering the optical subassembly and the discrete components upon the printed wiring board, leads of the optical subassembly and the discrete components are also soldered to appropriate bonding pads disposed upon the printed wiring board.

After cleaning the printed wiring board, the integrated circuits are mounted to the printed wiring board. In this regard, the integrated circuits are typically bonded, such as by means of an adhesive, to medial portions of the printed wiring board. While various adhesives can be employed, the adhesive is preferably a flexible, reworkable, thermoset adhesive. Adhesive is therefore initially disposed upon appropriate portions of the printed wiring board and the integrated circuits are then positioned upon the adhesive-applied printed wiring board. See blocks 78 and 80. After curing the adhesive, the printed wiring board is again cleaned, such as by means of plasma cleaning. Thereafter, wire bonds are formed between respective leads of the integrated circuits and wire bonding pads disposed upon the printed wiring board. See block 82. While different types of wire can be utilized, the wire of one embodiment is 0.001" diameter gold wire. After cleaning the fiber optic interface module, the fiber optic interface module is typically encapsulated, such as by applying a single layer of an organic "glop top" coating or a conformal coating of silicon nitride, silicon oxide, vapor deposited parylene or a combination thereof. See block 84. After curing the coating, the fiber optic interface module is typically tested and inspected prior to being shipped. See blocks 86 and 88.

In order to increase the cost effectiveness of the fabrication method of the present invention, a plurality of fiber optic interface modules can be formed upon a common panel that will subsequently be separated into a plurality of printed wiring boards, such as 144 printed wiring boards. In this regard, after soldering the optical subassemblies and the discrete components upon the respective printed wiring boards, the common panel can be separated into subpanels, each of which also typically includes a plurality of fiber optic interface modules, such as 36 fiber optic interface modules. After bonding the integrated circuits upon the respective printed wiring boards and testing the resulting fiber optic interface modules, the subpanels can be separated into respective modules.

By utilizing commercial off the shelf components, such as the transmitter optical assembly 14 and the receiver optical subassembly 54, the component cost of the resulting fiber optic interface module is reduced in comparison to conventional avionics grade FDDI fiber optic interface modules. Notably, the optical fiber and optoelectronic component of the commercial grade transmitter optical subassemblies and receiver optical subassemblies are prealigned such that no time consuming and costly manual alignment of a fiber pigtail needs to be performed. In addition, since the optical subassemblies do not include fiber pigtails, technicians no longer need to be concerned about breaking the fiber pigtail during the manufacturing process as can occur during the manufacture of conventional avionics grade FDDI fiber optic interface modules.

In addition to utilizing at least some commercial off the shelf components, the fabrication method of the present invention employs some of the newly developed, cost-effective fabrication techniques, such as the direct mounting of bare integrated circuits upon laminated printed wiring boards. See, for example, P. Clot, et al., "Ship on Board Technology for Low Cost Multi-Chip-Modules", Proceedings from Int'l Conference and Exhibition on Multichip Modules, pp. 455–60 (April 1994) and P. Thompson, "MCM-L Product Development Process for Low-Cost MCMs," Proceedings from Int'l Conference and Exhibition on Multichip Modules, pp. 449–54 (April 1994), which describe multichip modules and their mounting upon laminated printed wiring boards. Additionally, the application of organic "glob top" coatings or other conformal coatings further decreases the fabrication costs associated with the fiber optic interface device of the present invention since hermetic sealing is no longer required. As such, the method of this aspect of the present invention permits fiber optic interface modules, such as fiber optic transmitter modules 10 and fiber optic receiver modules 50, to be reliably manufactured in a cost effective manner. As such, the resulting fiber optic interface modules not only maintain the relatively high performance requirements for avionics and other specialized applications as described above, but also have a significantly lower cost than conventional avionics grade FDDI fiber optic interface modules.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A fiber optic transmitter module comprising:
   a printed wiring board defining a notch in at least one edge thereof and arm portions that define opposite edges of the notch;
   an integrated circuit mounted upon a medial portion of said printed wiring board such that said printed wiring board mechanically supports said integrated circuit, said integrated circuit comprising a driver circuit for providing a drive current; and
   a transmitter optical subassembly comprising a receptacle and a light source, said receptacle defining an internal cavity for receiving the light source and a pair of slots proximate the internal cavity and spaced apart from one another on opposite sides of the internal cavity for receiving respective arm portions of said printed wiring board without also receiving the light source, said light source being responsive to said driver circuit for transmitting signals in response to the drive current, said transmitter optical subassembly mounted to said printed wiring board so as to be at least partially disposed in the notch defined by said printed wiring board to thereby reduce path length between said light source and said integrated circuit and to correspondingly reduce circuit parasitics.

2. A fiber optic transmitter module according to claim 1 wherein said printed wiring board including the arm portions is planar.

3. A fiber optic transmitter module according to claim 1 wherein said printed wiring board comprises a substrate and electrical traces defined thereupon.

4. A fiber optic transmitter module according to claim 3 wherein both said light source and said integrated circuit are electrically connected to the same electrical trace such that the lead length of the light source is no greater than 2 millimeters.

5. A fiber optic transmitter module according to claim 3 wherein both said light source and said integrated circuit are electrically connected to the same electrical trace that defines a linear path across the substrate.

6. A fiber optic transmitter module according to claim 3 wherein both said light source and said integrated circuit are electrically connected to the same electrical trace that has a path length selected such that the total circuit parasitics are no greater than 2 picofarads.

7. A fiber optic transmitter module according to claim 1 further comprising a protective coating that encapsulates at least portions of said printed wiring board and said integrated circuit.

8. A fiber optic transmitter module according to claim 1 wherein said integrated circuit further comprises a temperature compensation bias generator for controllably altering the drive current in response to temperature variations such that said driver circuit continues to provide a predetermined drive current as the temperature fluctuates from −55° C. to 110° C.

9. A fiber optic receiver module comprising:
   a printed wiring board defining a notch in at least one edge thereof and arm portions that define opposite edges of the notch;
   an integrated circuit mounted upon a medial portion of said printed wiring board such that said printed wiring board mechanically supports said integrated circuit, said integrated circuit comprising an amplifier for amplifying signals received by the fiber optic receiver module; and
   a receiver optical subassembly comprising a receptacle and a detector, said receptacle defining an internal cavity for receiving the detector and a pair of slots proximate the internal cavity and spaced apart from one another on opposite sides of the internal cavity for receiving respective arm portions of said printed wiring board without also receiving the light source, said receiver optical subassembly mounted to said printed wiring board so as to be at least partially disposed in the notch defined by said printed wiring board to thereby reduce path length between said detector and said integrated circuit and to correspondingly reduce circuit parasitics.

10. A fiber optic receiver module according to claim 9 wherein said printed wiring board including the arm portions is planar.

11. A fiber optic receiver module according to claim 9 wherein said printed wiring board comprises a substrate and electrical traces defined thereupon.

12. A fiber optic receiver module according to claim 11 wherein both said detector and said integrated circuit are electrically connected via at least one electrical trace such that the lead length of the detector is no greater than 2 millimeters.

13. A fiber optic receiver module according to claim 11 wherein both said detector and said integrated circuit are electrically connected via at least one electrical trace that defines a linear path across the substrate.

14. A fiber optic receiver module according to claim 11 wherein both said detector and said integrated circuit are electrically connected via at least one electrical trace that collectively has a path length selected such that the total circuit parasitics are no greater than 2 picofarads.

15. A fiber optic receiver module according to claim 9 further comprising a protective coating that encapsulates at least portions of said printed wiring board and said sensitive circuit.

16. A method of fabricating a fiber optic interface module comprising:

providing a printed wiring board defining a notch in at least one edge thereof and arm portions that define opposite edges of the notch;

mounting an optical subassembly to the printed wiring board, wherein the optical subassembly is selected from the group consisting of a transmitter optical subassembly comprising a receptacle and a light source and a receiver optical subassembly comprising a receptacle and a light detector, wherein the receptacle defines an internal cavity in which one of the light source and the receptacle is disposed and a pair of slots proximate the internal cavity and spaced apart from one another on opposite sides of the internal cavity; and mounting an integrated circuit upon a medial portion of the printed wiring board such that the printed wiring board mechanically supports the integrated circuit, wherein the integrated circuit is selected from the group consisting of a transmitter integrated circuit comprising a driver circuit for providing a drive current and a receiver integrated circuit comprising an amplifier for amplifying signals received by the fiber optic interface module, wherein mounting the optical subassembly to the printed wiring board comprises inserting the arm portions of the printed circuit board into respective slots defined by the receptacle so as to mount the optical subassembly at least partially within the notch defined by the printed wiring board in order to reduce the path length between the optical subassembly and the integrated circuit and to correspondingly reduce circuit parasitics.

17. A method according to claim 16 further comprising encapsulating at least portions of the printed wiring board and the integrated circuit with a protective coating.

18. A method according to claim 16 wherein the optical subassembly comprises a plurality of leads, wherein the printed wiring board comprises a substrate and electrical traces defined thereupon, and wherein mounting the optical subassembly to the printed wiring board comprises:

surface mounting the optical subassembly to the printed wiring board; and soldering the leads of the optical subassembly to establish electrical contact with the electrical traces of the printed wiring board.

19. A method according to claim 16 wherein the printed wiring board comprises a substrate and wire bonding pads disposed thereupon, and wherein mounting the integrated circuit comprises:

adhesively bonding the integrated circuit to the printed wiring board; and establishing wire bonds between the integrated circuit and the wire bonding pads.

20. A method according to claim 16 wherein providing the printed wiring board comprises providing a laminated printed wiring board.

* * * * *